United States Patent
Boden et al.

(10) Patent No.: US 9,164,480 B2
(45) Date of Patent: Oct. 20, 2015

(54) HOLOGRAPHIC DATA STORAGE DEVICE AND METHOD OF MAKING

(75) Inventors: Eugene Pauling Boden, Scotia, NY (US); Brian Lee Lawrence, Clifton Park, NY (US); Xiaolei Shi, Niskayuna, NY (US)

(73) Assignee: General Electric Company, Niskayuna, NY (US)

( * ) Notice: Subject to any disclaimer, the term of this patent is extended or adjusted under 35 U.S.C. 154(b) by 2309 days.

(21) Appl. No.: 11/638,964

(22) Filed: Dec. 14, 2006

(65) Prior Publication Data

US 2008/0144146 A1   Jun. 19, 2008

(51) Int. Cl.

| | | |
|---|---|---|
| G03H 1/02 | (2006.01) | |
| G03F 7/00 | (2006.01) | |
| G03F 7/004 | (2006.01) | |
| G11B 7/0065 | (2006.01) | |
| G11B 7/24044 | (2013.01) | |
| G11B 7/26 | (2006.01) | |
| G11B 7/248 | (2006.01) | |
| G11B 7/246 | (2013.01) | |

(52) U.S. Cl.
CPC ................. *G03H 1/02* (2013.01); *G03F 7/001* (2013.01); *G03F 7/0045* (2013.01); *G11B 7/0065* (2013.01); *G11B 7/24044* (2013.01); *G11B 7/26* (2013.01); *G03H 2001/026* (2013.01); *G03H 2001/0264* (2013.01); *G11B 7/248* (2013.01); *G11B 2007/24612* (2013.01)

(58) Field of Classification Search
None
See application file for complete search history.

(56) References Cited

U.S. PATENT DOCUMENTS

| 5,026,619 | A | * | 6/1991 | Trundle | 430/19 |
|---|---|---|---|---|---|
| 5,088,086 | A | * | 2/1992 | Van et al. | 369/100 |
| 2005/0136333 | A1 | | 6/2005 | Lawrence et al. | |
| 2006/0073392 | A1 | | 4/2006 | Erben et al. | |
| 2007/0281247 | A1 | * | 12/2007 | Phillips et al. | 430/311 |

FOREIGN PATENT DOCUMENTS

| GB | 1464603 | * | 2/1977 |
| JP | 03-192345 | * | 8/1991 |
| JP | 2003-332199 | * | 11/2003 |

OTHER PUBLICATIONS

Ubukata et al. "phototactic mass transport in polymer films for micropatterning and alignment of functional materials", Adv. Mater., vol. 16(3) pp. 220-223 (Feb. 2004).*
Matsuoka, "Absorption spectra of dyes for diode lasers" in JOEM Handbook 2, frontispiece to p. 63 (1990).*
Schulte-Frohlinde et al., "Photochemical cis-trans isomerization of substituted stilbenes", J. Chem. Phys., vol. 66(12) pp. 2486-2491 (1962).*
Christoph Georg Erben et al.; "Methods for Making Holographic Data Storage Articles"; U.S. Appl. No. 11/260,806, filed Oct. 27, 2005.
Iain A. McCulloch; 'Novel Photoactive Nonlinear Optical Polymers for Use in Optical Waveguides'; Macromolecules, vol. 27, No. 7, 1994, pp. 1697-1702.

(Continued)

*Primary Examiner* — Martin Angebranndt
(74) *Attorney, Agent, or Firm* — Fletcher Yoder, P.C.

(57) ABSTRACT

Holographic data storage devices are presented. The holographic data storage device includes an optically transparent substrate, wherein the optically transparent substrate includes a photochemically active dye and a heat generating chromophore. Methods for making holographic data storage device are also presented.

22 Claims, 5 Drawing Sheets

(56) References Cited

OTHER PUBLICATIONS

"Magnetic Nanoparticles"; IMEGO Solutions beyond Sensors [Online], [Retrieved on Dec. 12, 2006] Retrieved from location: Home / Industry Solutions / Magnetic nanoparticles using Internet<URL: http://www.imego.com./85.aspx> (5 pages).

"Laser Blocking Dyes for Thermoplastics"; EPOLIN Infrared and Laser Absorbing Dyes [Online], [Retrieved on Dec. 12, 2006] Retrieved using Internet<URL: http://epolin.com/index.cfm?CFID=32587150&CFTOKEN=93366502&MenuItemID=114&MenuSubID=20&MenuGroup=Products> (2 pages).

\* cited by examiner

HOLOGRAPHIC DATA STORAGE DEVICE AND METHOD OF MAKING

CROSS REFERENCE TO RELATED APPLICATIONS

This application is related to U.S. patent application entitled "HOLOGRAPHIC DATA STORAGE METHOD AND SYSTEM," which corresponds to U.S. application Ser. No. 11/638,964, filed on Dec. 14, 2006, the entire contents of which are incorporated herein by reference.

BACKGROUND

The invention relates generally to optical data storage techniques and more particularly to holographic data storage techniques.

Holographic storage is the storage of data in the form of holograms, which are images of three dimensional interference patterns created by the intersection of two beams of light, in a photosensitive storage medium. Both page-based holographic techniques and bit-wise holographic techniques have been pursued. In page-based holographic data storage, a signal beam which contains digitally encoded data, typically a plurality of bits, is superposed on a reference beam within the volume of the storage medium resulting in a chemical reaction which, for example, changes or modulates the refractive index of the medium within the volume. This modulation serves to record both the intensity and phase information from the signal. Each bit is therefore generally stored as a part of the interference pattern. The hologram can later be retrieved by exposing the storage medium to the reference beam alone, which interacts with the stored holographic data to generate a reconstructed signal beam proportional to the initial signal beam used to store the holographic image. In bit-wise holography or microholographic data storage, every bit is written as a microhologram or reflection grating typically generated by two counter propagating focused recording beams. The data is then retrieved by using a read beam to diffract off the microhologram to reconstruct the recording beam.

Recently, dye-doped data storage materials based on polymeric materials have been developed for holographic data storage. The dyes have a narrow absorption band at visible light wavelengths. Upon light absorption, they undergo a photochemical conversion, which produces a change of refractive index of the material, according to the Kramers-Kronig relation. Due to the resonant absorption of the dyes, the refractive index change could be high (~0.01). This provides a beneficial potential for obtaining a high data capacity. In addition, the thermoplastic material has a much smaller shrinkage compared with photopolymer material and has very good optical quality, and is comparatively economical. These features make the dye-doped thermoplastics a very attractive candidate for holographic storage.

As discussed above, data is typically written by focusing and interfering two laser beams within the media to photochemically convert specific regions. Unfortunately, the light must pass through the entire media even though only specific areas are to be converted. Although the beams are most intense in the focused areas and produce the most conversion, low levels of the dye are converted throughout the media. Thus, after one layer of data is written and another layer is then written into subsequent layers, an undesirable additional photochemical conversion of the data in the first layer occurs. This ultimately limits the number of layers of data that can be written into the media, which limits the overall storage capacity. A second problem arises from the fact that the material should have high QEs in order to have a useful sensitivity for commercial applications. Materials with high QEs are then subject to rapid photochemical conversion of the data even when using a low power reading laser, so the data can only be read a limited number of times before the disk becomes unreadable.

Accordingly, a technique is needed to address one or more of the foregoing problems in holographic data storage devices.

BRIEF DESCRIPTION

Briefly, in accordance with aspects of the present invention, a holographic data storage device is presented. The holographic data storage device includes an optically transparent substrate, wherein the optically transparent substrate includes a photochemically active dye and a heat generating chromophore.

In accordance with further aspects of the present invention, a holographic data storage device is presented. The holographic data storage device includes an optically transparent substrate, wherein the optically transparent substrate includes a photochemically active dye and a reverse saturable absorber chromophore.

In accordance with still further aspects of the present invention, a holographic data storage device is presented. The holographic data storage device includes an optically transparent substrate, wherein the optically transparent substrate includes a photochemically active dye configured to convert to a photo-product upon irradiation and a heat generating chromophore configured to generate heat upon excitation.

In accordance with further aspects of the present invention, a method of making a holographic storage device is presented. The method includes mixing an optically transparent plastic material, a photochemically active dye, and a heat generating chromophore to form a mixed composition, and molding the mixed composition to form a holographic storage device.

DRAWINGS

These and other features, aspects, and advantages of the present invention will become better understood when the following detailed description is read with reference to the accompanying drawings in which like characters represent like parts throughout the drawings, wherein.

DETAILED DESCRIPTION

Embodiments of the present invention disclose holographic data storage devices and method for making holographic data storage devices.

Some aspects of the present invention and general scientific principles used herein can be more clearly understood by referring to U.S. Patent Application 2005/0136333 (Ser. No. 10/742,461), which was published on Jun. 23, 2005; co-pending Application having Ser. No. 10/954,779, filed on Sep. 30, 2004; and co-pending Application having Ser. No. 11/260,806, filed on Oct. 27, 2005; all of which are incorporated herein by reference in their entirety. It should be noted that with respect to the interpretation and meaning of terms in the present application, in the event of a conflict between this application and any document incorporated herein by reference, the conflict is to be resolved in favor of the definition or interpretation provided by the present application.

As used herein, the term "aromatic radical" refers to an array of atoms having a valence of at least one comprising at least one aromatic group. The array of atoms having a valence of at least one comprising at least one aromatic group may include heteroatoms such as nitrogen, sulfur, selenium, silicon and oxygen, or may be composed exclusively of carbon and hydrogen. As used herein, the term "aromatic radical" includes but is not limited to phenyl, pyridyl, furanyl, thienyl, naphthyl, phenylene, and biphenyl radicals. As noted, the aromatic radical contains at least one aromatic group. The aromatic group is invariably a cyclic structure having 4n+2 "delocalized" electrons where "n" is an integer equal to 1 or greater, as illustrated by phenyl groups (n=1), thienyl groups (n=1), furanyl groups (n=1), naphthyl groups (n=2), azulenyl groups (n=2), anthraceneyl groups (n=3) and the like. The aromatic radical may also include nonaromatic components. For example, a benzyl group is an aromatic radical which comprises a phenyl ring (the aromatic group) and a methylene group (the nonaromatic component). Similarly a tetrahydronaphthyl radical is an aromatic radical comprising an aromatic group ($C_6H_3$) fused to a nonaromatic component $—(CH_2)_4—$. For convenience, the term "aromatic radical" is defined herein to encompass a wide range of functional groups such as alkyl groups, alkenyl groups, alkynyl groups, haloalkyl groups, haloaromatic groups, conjugated dienyl groups, alcohol groups, ether groups, aldehyde groups, ketone groups, carboxylic acid groups, acyl groups (for example carboxylic acid derivatives such as esters and amides), amine groups, nitro groups, and the like. For example, the 4-methylphenyl radical is a $C_7$ aromatic radical comprising a methyl group, the methyl group being a functional group which is an alkyl group. Similarly, the 2-nitrophenyl group is a $C_6$ aromatic radical comprising a nitro group, the nitro group being a functional group. Aromatic radicals include halogenated aromatic radicals such as 4-trifluoromethylphenyl, hexafluoroisopropylidenebis(4-phen-1-yloxy) (i.e., $—OPhC(CF_3)_2PhO—$), 4-chloromethylphen-1-yl, 3-trifluorovinyl-2-thienyl, 3-trichloromethylphen-1-yl (i.e., 3-$CCl_3Ph—$), 4-(3-bromoprop-1-yl)phen-1-yl (i.e., 4-$BrCH_2CH_2CH_2Ph—$), and the like. Further examples of aromatic radicals include 4-allyloxyphen-1-oxy, 4-aminophen-1-yl (i.e., 4-$H_2NPh—$), 3-aminocarbonylphen-1-yl (i.e., $NH_2COPh—$), 4-benzoylphen-1-yl, dicyanomethylidenebis(4-phen-1-yloxy) (i.e., $—OPhC(CN)_2PhO—$), 3-methylphen-1-yl, methylenebis(4-phen-1-yloxy) (i.e., $—O PhCH_2PhO—$), 2-ethylphen-1-yl, phenylethenyl, 3-formyl-2-thienyl, 2-hexyl-5-furanyl, hexamethylene-1,6-bis(4-phen-1-yloxy) (i.e., $—OPh(CH_2)_6PhO—$), 4-hydroxymethylphen-1-yl (i.e., 4-$HOCH_2Ph—$), 4-mercaptomethylphen-1-yl (i.e., 4-$HSCH_2Ph—$), 4-methylthiophen-1-yl (i.e., 4-$CH_3SPh—$), 3-methoxyphen-1-yl, 2-methoxycarbonylphen-1-yloxy (e.g., methyl salicyl), 2-nitromethylphen-1-yl (i.e., 2-$NO_2CH_2Ph$), 3-trimethylsilylphen-1-yl, 4-t-butyldimethylsilylphenl-1-yl, 4-vinylphen-1-yl, vinylidenebis (phenyl), and the like. The term "a $C_3$-$C_{10}$ aromatic radical" includes aromatic radicals containing at least three but no more than 10 carbon atoms. The aromatic radical 1-imidazolyl ($C_3H_2N_2—$) represents a $C_3$ aromatic radical. The benzyl radical ($C_7H_7—$) represents a $C_7$ aromatic radical.

As used herein the term "cycloaliphatic radical" refers to a radical having a valence of at least one, and comprising an array of atoms which is cyclic but which is not aromatic. As defined herein a "cycloaliphatic radical" does not contain an aromatic group. A "cycloaliphatic radical" may comprise one or more noncyclic components. For example, a cyclohexylmethyl group ($C_6H_{11}CH_2—$) is a cycloaliphatic radical which comprises a cyclohexyl ring (the array of atoms which is cyclic but which is not aromatic) and a methylene group (the noncyclic component). The cycloaliphatic radical may include heteroatoms such as nitrogen, sulfur, selenium, silicon and oxygen, or may be composed exclusively of carbon and hydrogen. For convenience, the term "cycloaliphatic radical" is defined herein to encompass a wide range of functional groups such as alkyl groups, alkenyl groups, alkynyl groups, haloalkyl groups, conjugated dienyl groups, alcohol groups, ether groups, aldehyde groups, ketone groups, carboxylic acid groups, acyl groups (for example carboxylic acid derivatives such as esters and amides), amine groups, nitro groups, and the like. For example, the 4-methylcyclopent-1-yl radical is a $C_6$ cycloaliphatic radical comprising a methyl group, the methyl group being a functional group which is an alkyl group. Similarly, the 2-nitrocyclobut-1-yl radical is a $C_4$ cycloaliphatic radical comprising a nitro group, the nitro group being a functional group. A cycloaliphatic radical may comprise one or more halogen atoms which may be the same or different. Halogen atoms include, for example; fluorine, chlorine, bromine, and iodine. Cycloaliphatic radicals comprising one or more halogen atoms include 2-trifluoromethylcyclohex-1-yl, 4-bromodifluoromethylcyclooct-1-yl, 2-chlorodifluoromethylcyclohex-1-yl, hexafluoroisopropylidene-2,2-bis (cyclohex-4-yl) (i.e., $—C_6H_{10}C(CF_3)_2 C_6H_{10}—$), 2-chloromethylcyclohex-1-yl, 3-difluoromethylenecyclohex-1-yl, 4-trichloromethylcyclohex-1-yloxy, 4-bromodi chloromethylcyclohex-1-ylthio, 2-bromoethylcyclopent-1-yl, 2-bromopropylcyclohex-1-yloxy (e.g., $CH_3CHBrCH_2C_6H$ oO—), and the like. Further examples of cycloaliphatic radicals include 4-allyloxycyclohex-1-yl, 4-aminocyclohex-1-yl (i.e., $H_2C_6H_{10}$), 4-aminocarbonylcyclopent-1-yl (i.e., $NH_2COC_5H_8—$), 4-acetyloxycyclohex-1-yl, 2,2-dicyanoisopropylidenebis(cyclohex-4-yloxy) (i.e., $—OC_6H_{10}C(CN)_2C_6H_{10}O—$), 3-methylcyclohex-1-yl, methylenebis(cyclohex-4-yloxy) (i.e., $—OC_6H_{10}CH_2C_6H_{10}—$), 1-ethylcyclobut-1-yl, cyclopropylethenyl, 3-formyl-2-terahydrofuranyl, 2-hexyl-5-tetrahydrofuranyl, hexamethylene-1,6-bis(cyclohex-4-yloxy) (i.e., $—O C_6H_{10}(CH_2)_6C_6H_{10}O—$), 4-hydroxymethylcyclohex-1-yl (i.e., 4-$HOCH_2C_6H_{10}—$), 4-mercaptomethylcyclohex-1-yl (i.e., 4-$HSCH_2C_6H_{10}—$), 4-methylthiocyclohex-1-yl (i.e., 4-$CH_3SC_6H_{10}—$), 4-methoxycyclohex-1-yl, 2-methoxycarbonylcyclohex-1-yloxy (2-$CH_3OCOC_6H_{10}O—$), 4-nitromethylcyclohex-1-yl (i.e., $NO_2CH_2C_6H_{10}—$), 3-trimethylsilylcyclohex-1-yl, 2-t-butyldimethylsilylcyclopent-1-yl, 4-trimethoxysilylethylcyclohex-1-yl (e.g., $(CH_3O)_3 SiCH_2CH_2C_6H_{10}—$), 4-vinylcyclohexen-1-yl, vinylidenebis (cyclohexyl), and the like. The term "a $C_3$-$C_{10}$ cycloaliphatic radical" includes cycloaliphatic radicals containing at least three but no more than 10 carbon atoms. The cycloaliphatic radical 2-tetrahydrofuranyl ($C_4H_7O$—) represents a $C_4$ cycloaliphatic radical. The cyclohexylmethyl radical ($C_6H_{11}CH_2$—) represents a $C_7$ cycloaliphatic radical.

As used herein the term "aliphatic radical" refers to an organic radical having a valence of at least one consisting of a linear or branched array of atoms which is not cyclic. Aliphatic radicals are defined to comprise at least one carbon atom. The array of atoms comprising the aliphatic radical may include heteroatoms such as nitrogen, sulfur, silicon, selenium and oxygen or may be composed exclusively of carbon and hydrogen. For convenience, the term "aliphatic radical" is defined herein to encompass, as part of the "linear or branched array of atoms which is not cyclic" a wide range of functional groups such as alkyl groups, alkenyl groups, alkynyl groups, haloalkyl groups, conjugated dienyl groups, alcohol groups, ether groups, aldehyde groups, ketone groups, carboxylic acid groups, acyl groups (for example carboxylic acid derivatives such as esters and amides), amine groups, nitro groups, and the like. For example, the 4-methylpent-1-yl radical is a $C_6$ aliphatic radical comprising a methyl group, the methyl group being a functional group which is an alkyl group. Similarly, the 4-nitrobut-1-yl group is a $C_4$ aliphatic radical comprising a nitro group, the nitro group being a functional group. An aliphatic radical may be a haloalkyl group which comprises one or more halogen atoms which may be the same or different. Halogen atoms include, for example; fluorine, chlorine, bromine, and iodine. Aliphatic radicals comprising one or more halogen atoms include the alkyl halides trifluoromethyl, bromodifluoromethyl, chlorodifluoromethyl, hexafluoroisopropylidene, chloromethyl, difluorovinylidene, trichloromethyl, bromodichloromethyl, bromoethyl, 2-bromotrimethylene (e.g., —$CH_2CHBrCH_2$—), and the like. Further examples of aliphatic radicals include allyl, aminocarbonyl (i.e., —$CONH_2$), carbonyl, 2,2-dicyanoisopropylidene (i.e., —$CH_2C(CN)_2CH_2$—), methyl (i.e., —$CH_3$), methylene (i.e., —$CH_2$—), ethyl, ethylene, formyl (i.e., —CHO), hexyl, hexamethylene, hydroxymethyl (i.e., —$CH_2OH$), mercaptomethyl (i.e., —$CH_2SH$), methylthio (i.e., —$SCH_3$), methylthiomethyl (i.e., —$CH_2SCH_3$), methoxy, methoxycarbonyl (i.e., $CH_3OCO$—), nitromethyl (i.e., —$CH_2NO_2$), thiocarbonyl, trimethylsilyl (i.e., ($CH_3)_3Si$—), t-butyldimethylsilyl, 3-trimethyoxysilylpropyl (i.e., ($CH_3O)_3SiCH_2CH_2CH_2$—), vinyl, vinylidene, and the like. By way of further example, a $C_1$-$C_{10}$ aliphatic radical contains at least one but no more than 10 carbon atoms. A methyl group (i.e., $CH_3$—) is an example of a $C_1$ aliphatic radical. A decyl group (i.e., $CH_3(CH_2)_9$—) is an example of a $C_{10}$ aliphatic radical.

As defined herein, the term "optically transparent" as applied to an optically transparent substrate or an optically transparent plastic material means that the substrate or plastic material has an absorbance of less than 1. That is, at least 10 percent of incident light is transmitted through the material at least one wavelength in a range between about 300 and about 800 nanometers. For example, when configured as a film having a thickness suitable for use in holographic data storage the film exhibits an absorbance of less than 1 at least one wavelength in a range between about 300 and about 800 nanometers.

As defined herein, the term "volume element" means a three dimensional portion of a total volume.

As defined herein, the term "optically readable datum" can be understood as a datum that is stored as a hologram patterned within one or more volume elements of an optically transparent substrate.

As defined herein, the term "photochemical conversion" refers to the property of a molecule that it can be converted from a stable state A to a stable state B by a wavelength $\lambda_A$. This conversion is accompanied by a change in the visible absorption spectrum and the refractive index of the material.

As noted, holographic data storage relies upon the introduction of localized variations in the refractive index of the optically transparent substrate comprising the photochemically active dye as a means of storing holograms. The refractive index within an individual volume element of the optically transparent substrate may be constant throughout the volume element, as in the case of a volume element that has not been exposed to electromagnetic radiation, or in the case of a volume element in which the photochemically active dye has been reacted to the same degree throughout the volume element. It is believed that most volume elements that have been exposed to electromagnetic radiation during the holographic data writing process will contain a complex holographic pattern, and as such, the refractive index within the volume element will vary across the volume element. In instances in which the refractive index within the volume element varies across the volume element, it is convenient to regard the volume element as having an "average refractive index" which may be compared to the refractive index of the corresponding volume element prior to irradiation. Thus, in one embodiment an optically readable datum comprises at least one volume element having a refractive index that is different from a (the) corresponding volume element of the optically transparent substrate prior to irradiation. Data storage is achieved by locally changing the refractive index of the data storage medium in a graded fashion (for example, continuous sinusoidal variations), and then using the induced changes as diffractive optical elements.

Sensitivity (S) is a measure of the diffraction efficiency of a hologram recorded using a certain amount of light fluence (F). The light fluence (F) is given by the product of light intensity (I) and recording time (t). Mathematically, sensitivity is given by equation (3), $$S = \frac{\sqrt{\eta}}{I \cdot t \cdot L} \text{ (cm/J)} \quad \text{Equation (3)}$$

wherein I is the intensity of the recording beam, "t" is the recording time, L is the thickness of the recording (or data storage) medium (example, disc), and $\eta$ is the diffraction efficiency. Diffraction efficiency is given by equation (4), $$\eta = \sin^2\left(\frac{\pi \cdot \Delta n \cdot L}{\lambda \cdot \cos(\theta)}\right) \quad \text{Equation (4)}$$

wherein $\lambda$ is the wavelength of light in the recording medium, $\theta$ is the recording angle in the media, and $\Delta n$ is the refractive index contrast of the grating, which is produced by the recording process, wherein the dye molecule undergoes a photochemical conversion.

The absorption cross section is a measurement of an atom or molecule's ability to absorb light at a specified wavelength, and is measured in square cm/molecule. It is generally denoted by $\sigma(\lambda)$ and is governed by the Beer-Lambert Law for optically thin samples as shown in equation (5), $$\sigma(\lambda) = \ln(10) \cdot \frac{\text{Absorbance}(\lambda)}{N_0 \cdot L} \quad (\text{cm}^2) \qquad \text{Equation (5)}$$

wherein $N_0$ is the concentration in molecules per cubic centimeter, and L is the sample thickness in centimeters.

Quantum efficiency (QE) is a measure of the probability of a photochemical transition for each absorbed photon of a given wavelength. Thus, it gives a measure of the efficiency with which incident light is used to achieve a given photochemical conversion. QE is given by equation (6), $$QE = \frac{hc/\lambda}{\sigma \cdot F_0} \qquad \text{Equation (6)}$$

wherein "h" is the Planck's constant, "c" is the velocity of light, $\sigma(\lambda)$ is the absorption cross section at the wavelength $\lambda$, and $F_0$ is the photochemical conversion fluence. The parameter $F_0$ is given by the product of light intensity (I) and a time constant ($\tau$) that characterizes the photochemical conversion process.

Typically, the photochemically active dyes undergo a light induced chemical reaction (photochemical conversion) when exposed to light with a wavelength within the absorption range to form at least one photo-product. This reaction can be a photo-decomposition reaction, such as oxidation, reduction, or bond breaking to form smaller constituents, or a molecular rearrangement, such as a sigmatropic rearrangement, or addition reactions including pericyclic cycloadditions. Thus in an embodiment, data storage in the form of holograms is achieved wherein the photo-product is patterned (for example, in a graded fashion) within the modified optically transparent substrate to provide the at least one optically readable datum.

Some photochemically active dyes exhibit low quantum efficiency (QE) in solid polymer matrix at or near room temperature. For example, it is reported in the art that the QE of an o-nitrostilbene dye to be 0.000404 at 488 nm and 0.000382 at 514 nm in a Poly(methyl methacrylate) (PMMA) matrix. It has also been reported that the same dye in a dilute hexane solution had a QE of 0.11 at a wavelength of 488 nm and a QE of 0.065 at a wavelength 514 nm. The Applicants have measured and concluded that these dyes in polycarbonate matrices have comparable or slightly higher QEs ($\sim 10^{-3}$-$10^{-2}$) as in PMMA. Although the applicants do not wish to be bound by any particular theory, it is believed that that rigid polymer networks can lower the mobility and consequently retard Quantum Efficiencies (QE) for certain photochemical reactions.

The Applicants have discovered that some these photochemically active dyes show significant increase in the quantum efficiency upon heating. In one embodiment of the present invention, a quantum efficiency of a photochemically active dye within a polymer matrix is enhanced. In a further embodiment, a quantum efficiency of a photochemically active dye within specific regions (with uniform dye distribution) of a polymer matrix is enhanced.

In one embodiment, this enhancement is attained by heating the polymer matrix to temperatures above room temperature. In one embodiment, the enhancement in quantum efficiency is obtained by localized heating of the polymer to at or above the Tg (glass transition temperature) of the thermoplastic. In one embodiment, this localized heating results in localized molten regions of the thermoplastic.

In some embodiments, the QE is increased by a factor greater than 50. In some further embodiments, the QE is increased by a factor greater than 100. In still further embodiments, the QE is increased by a factor greater than or about 1000. This enhancement directly enhances the sensitivity of the material in a similar manner.

In particular, this enhancement provides a gating process in which dye molecules in very discrete molten regions of the media undergo photochemical reactions faster than in the surrounding amorphous material, which enables writing on many virtual layers of the media without significantly effecting other layers. It also enables reading and writing at wavelengths that will not ultimately have significant impact on photochemically converting the data as the information is read out.

In one embodiment of the present invention, the volume element into which a holographic data is stored is heated to above room temperature. In one embodiment, the volume element is heated to raise the temperature to at or above Tg of the optically transparent substrate. In one embodiment, the temperature of the volume element is increased by localized heating of the volume element.

A non-limiting example of a class of dyes in a solid matrix that exhibit an increase in quantum efficiency upon heating are ortho-nitrostilbenes. Although o-nitrostilbenes class of dyes have been used to describe the various embodiments of the present invention, the invention is not restricted to this class of dyes. Any photochemically active dye that has a low QE for photochemical conversion in a solid polymer matrix at or near room temperature, but displays an increased QE upon heating, falls within the scope of this invention. In a non-limiting example, the QE for photochemical conversion of a photochemically active dye in a room temperature polymer matrix used in embodiments of the present invention, is less than about 0.005.

Non-limiting examples of nitrostilbenes include 4-dimethylamino-2'-4'-dinitrostilbene, 4-dimethylamino-4'-cyano-2'-nitrostilbene, 4-hydroxy-2'-4'-dinitrostilbene, and 4-methoxy-2',4'-dinitrostilbene and combinations thereof.

Similar to unimolecular reactions, such as the photochemical conversion of nitrostilbenes, bimolecular reactions, such as the dimerization of stilbenes, also exhibit low QEs at low concentrations, for example, when present in amounts less than 10 weight percent of the total weight of the optically transparent substrate. In one embodiment, thermal activation enables the photochemical dimerization process to occur with greater efficiency.

In one embodiment of the present invention, the thermal gating or thermal activation is achieved by heating the polymer matrix. In one embodiment of the present invention, the thermal gating or thermal activation is achieved by localized heating of the polymer matrix. In a non-limiting example a radiofrequency (RF) source can be used to locally heat a volume in a polymer matrix before writing a hologram into the volume. In another non-limiting example, optical radiation is used to locally heat a volume in a polymer matrix to locally increase the temperature before writing a hologram into the volume.

In one embodiment, the heating may be done using the process of radio frequency (RF) induction heating. In a non-limiting example, a pair of small coils is placed on each side of the holographic storage device and are aligned to the position of the optical pick-up through which the laser beam used to write the holographic data is incident on the holographic storage device. The coils are energized with an RF signal at a frequency that is selected to be absorbed by the substrate. In a non-limiting example, a 27.12 MHz RF frequency source is used to raise the temperature of a PMMA based substrate including a photochemically active dye, to above its Tg. As the desired volume element of the substrate passes between the coils (i.e. as the disc/device spins) the region of the substrate between the coils is heated above the Tg, resulting in an increased QE. Exposure to interfering laser beams will then result in the recording of an optically readable datum.

In another embodiment of the present invention, the thermal gating or thermal activation is achieved by including in the polymer matrix, materials that are capable of generating heat. In one embodiment such materials include heat generating chromophores, which absorb at optical wavelengths and deexcite to generate heat.

Although a variety of dyes could act as thermally and photochemically stable dyes for the heating purposes, dyes that behave non-linearly are particularly suitable. In one embodiment of the present invention, the thermal gating is achieved by including in the polymer matrix, reverse saturable absorbers (RSA), also known as excited state absorbers. Dyes with a reverse saturable absorption property, in which the absorption is a function of the fluence and increases with increasing fluence, are useful as the light absorbing chromophore. As a consequence of the reverse saturable absorption property, absorption of light by the chromophore present in the polymer composition is highest at the light beam(s) focus, which means background linear absorption is small. In one embodiment, at low fluence, such materials may be highly optically transparent and exhibit absorbance of much less than 1, (e.g. 0.01 to 0.1) in a range between about 300 and about 800 nanometers. In one embodiment the light absorbing chromophore is a heat generating chromophore, whereby upon absorption of light the chromophore deexcites to generate heat. In one embodiment the reverse saturable absorber chromophore is excited at a wavelength from about 500 nm to 800 nm.

RSAs typically have a very weak absorption in a portion of the spectra well away from other strong absorptions of the dye, but form strong transient triplet-triplet absorption when the intensity of the light surpasses a threshold level. Once surpassed, the dye absorbs strongly at this focused point and can quickly heat the material to very high temperatures at this point.

Non-limiting examples of reverse saturable absorbers include phthalocyanine dye, such as Irgaphor® Ultragreen MX (commercially available from Ciba-), copper phthalocyanine, lead phthalocyanine, zinc phthalocyanine, indium phthalocyanine, indium tetra-butyl phthalocyanine, gallium phthalocyanine, cobalt phthalocyanine, platinum phthalocyanine, nickel phthalocyanine, tetra-4-sulfonatophenylporphyrinato-copper(II) and tetra-4-sulfonatophenylporphyrinato-zinc(II). In a non-limiting example, some dyes act as reverse saturable absorbers at certain wavelengths or wavelength ranges. For example, some phthalocyanine dyes behave as reverse saturable absorbers at a wavelength of about 532 nm.

Porphyrin and phthalocyanine dyes are mentioned here by way of non-limiting examples only and a wide variety of other dyes displaying RSA properties are possible. These include a variety of metallophthalocyanines and fullerene dyes that typically have a very weak absorption in a portion of the spectrum well separated from other strong absorptions of the dye, but nonetheless exhibit robust transient triplet-triplet absorption when the intensity of the light surpasses a threshold level.

Other examples of heat generating chromophores include linear responsive absorber chromophores. In one embodiment, the linear responsive absorber chromophore is excited at a wavelength from about 300-800 nm. In another embodiment, the linear responsive absorber is an infrared absorbing dye.

In a non-limiting example, some dyes act as linear responsive absorbers at certain wavelengths or wavelength ranges. For example, some phthalocyanine dyes behave as linear responsive absorbers in a wavelength range from about 600 nm to about 750 nm. Other examples of linear responsive absorbers include anthraquinone dyes, rhodamine dyes, triarylmethine dyes, tris amminium dyes, and metal dithiolene dyes.

In one embodiment, the heat generating chromophore is a metallic or core shell nanoparticle. In one embodiment, the nanoparticles have a diameter in arrange from about 5 to about 60 nm. Metallic nanoparticles are known to provide strong local field enhancements and therefore would be desirable. Non-limiting examples of nanoparticles suitable for use in embodiments of the present invention include gold or silver spherical nano-particles, gold or silver ellipsoidal nano-particles, gold or silver nano-rods, gold or silver coated core-shell nano-particles, gold or silver triangular nano-particles. In one embodiment, thermal activation is achieved by heating the nanoparticles at their resonance wavelength. In one embodiment, the nanoparticles are excited at a wavelength from about 300 nm to 800 nm.

In one embodiment, the nanoparticles are magnetic nanoparticles. Suitable examples of materials for magnetic nanoparticles include iron oxides such as magnetite or maghemite. In one embodiment, an AC magnetic field at a specific frequency and amplitude is applied to an optically transparent substrate including a photochemically active dye and magnetic nanoparticles. The magnetic nanoparticles absorb the energy, resulting in an increase in the local temperature around the nanoparticle system, this results in an increased QE for photochemical conversion of the photochemically active dye.

In accordance with one exemplary embodiment of the present invention, a method for storing holographic data is provided. The method includes the step of thermal activation, wherein the QE is enhanced locally (at least some part of a volume element into which a hologram will be written into) during the step of photochemical conversion.

In one example, thermal activation includes exciting the heat generating chromophore using a source such as optical radiation, whereby upon deexcitation the heat generating chromophore releases energy, locally heating the at least a part of the volume element. In one example, this localized source creates a localized molten state of the substrate material and leads to an increase in QE of the photochemically active dye during the photochemical conversion process.

In one embodiment, the thermal activation source and the photochemical conversion source are applied simultaneously. In another example, the application of the thermal activation source and photochemical conversion source at least partially overlap. In another embodiment, the sources are applied sequentially. In yet another example, the application of the photochemical conversion source falls within a time period of application of the thermal activation source.

Figure 1:
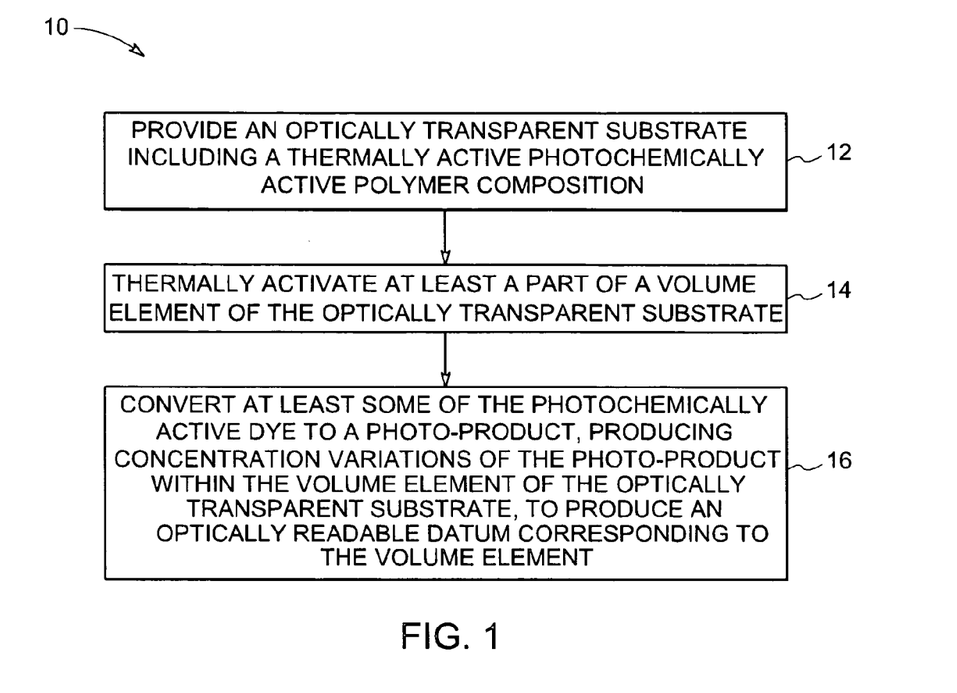
FIG. 1 is a flow chart illustrating an exemplary process for storing holographic data according to aspects of the present invention.

FIG. 1 is a flow chart illustrating an exemplary process 10 of storing holographic data. The process includes providing an optically transparent substrate including a thermally active photochemically active polymer composition, the polymer composition comprising a photochemically active dye and a heat generating chromophore (step 12). In a non-limiting example, a heat generating chromophore is an RSA. In step 14, at least a part of a volume element of the optically transparent substrate is thermally activated to increase a quantum efficiency of photochemical conversion of the photochemically active dye into a photo-product, within the at least a part of the volume element. In one example, thermally activating includes exciting the heat generating chromophore using a source such as optical radiation, whereby upon deexcitation the heat generating chromophore releases energy. In one example, this heating locally creates a molten state of the substrate with the photochemically active dye and leads to an increase in QE. In step 16, at least some of the photochemically active dye is converted to a photo-product, to produce concentration variations of the photo-product within the volume element of the optically transparent substrate, thereby producing an optically readable datum corresponding to the volume element.

Figure 2:
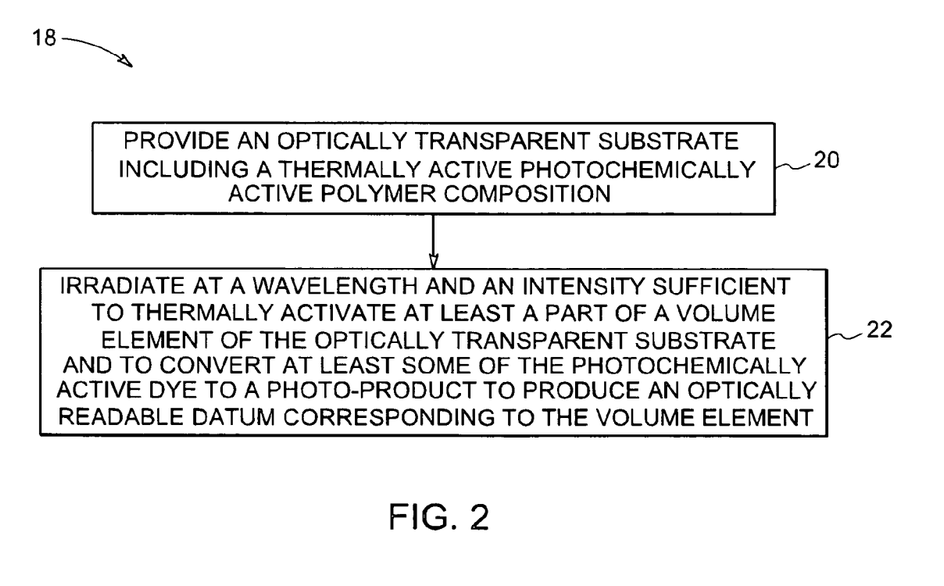
FIG. 2 is a flow chart illustrating another exemplary process for storing holographic data according to aspects of the present invention.

FIG. 2 is a flow chart illustrating another exemplary process 18 of storing holographic data. The process includes providing an optically transparent substrate including a thermally active photochemically active polymer composition, the polymer composition comprising a photochemically active dye and a heat generating chromophore (step 20). In a non-limiting example, a heat generating chromophore is an RSA. In step 22 the step of thermally activating and the step of converting at least some of the photochemically active dye to a photo-product is achieved in a unitary step. The step 22 includes irradiating with a holographic interference pattern at a first wavelength and a first intensity sufficient to thermally activate at least some of the heat generating chromophore to thermally activate to increase a quantum efficiency of photochemical conversion of the photochemically active dye into a photo-product and to convert at least some of the photochemically active dye to a photo-product within the volume element. For example, the two dyes, the photochemically active dye and the heat generating chromophore, are chosen such that a single source, a holographic interference pattern generated using a 532 nm pulsed laser, for example, is used to both thermally activate and to photochemically convert the dye.

Figure 3:
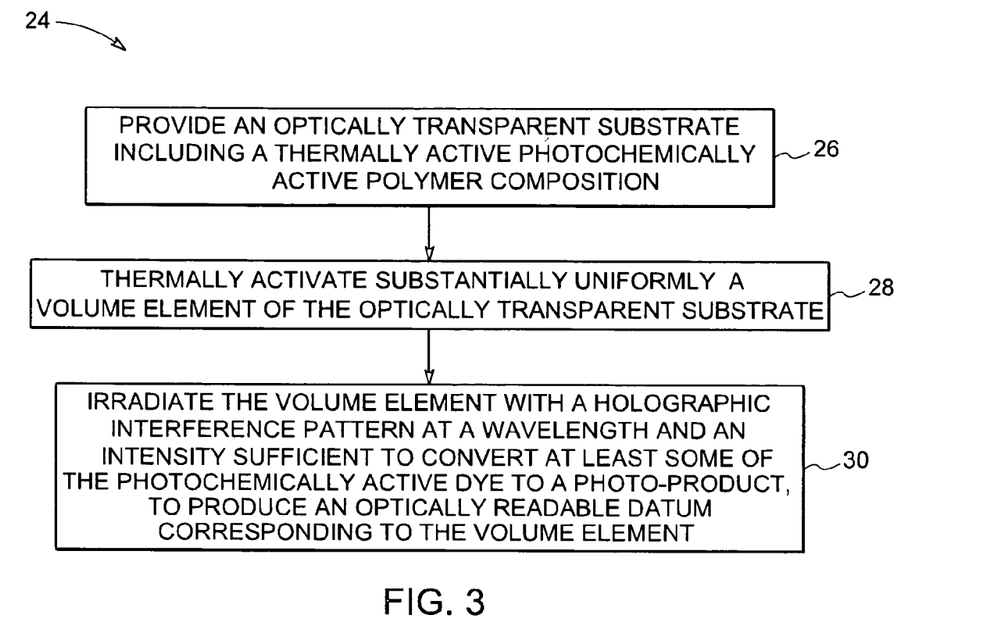
FIG. 3 is a flow chart illustrating another exemplary process for storing holographic data according to aspects of the present invention.

In one embodiment, a first radiation source used to excite the heat generating chromophore is substantially uniform and heat is generated substantially uniformly within the volume element and the radiation used to photochemically convert the photochemically active dye is patterned. The combination results in a refractive index variation within the volume element to produce an optically readable datum. FIG. 3 is a flow chart illustrating an exemplary process 24 of storing holographic data. The process includes providing an optically transparent substrate including a thermally active photochemically active polymer composition, the polymer composition comprising a photochemically active dye and a heat generating chromophore (step 26). In step 28, a volume element of the optically transparent substrate is thermally activated in a substantially uniform manner. In step 30, the volume element is irradiated with a holographic interference pattern at a wavelength and an intensity sufficient to convert at least some of the photochemically active dye to a photo-product, to produce an optically readable datum corresponding to the volume element.

In one embodiment, a focused beam at a first wavelength is used to trigger the RSA in a region and create a localized molten region. Then a source at a second wavelength produces interference fringes within the molten region where the photochemically active dye can be converted with enhanced QE and produce the hologram. When the pulse at the first wavelength used to excite the RSA is over and the local temperature drops back, the hologram is frozen in place. In a non-limiting example, the hologram is frozen within a millisecond after thermal activation stops. It is expected there will be very little movement of the polymer chains laterally so the hologram that is written into the molten polymer will stay intact and the hologram will be frozen as the temperature drops back. In one embodiment, the duration of thermal action is short enough so that the photochromic dyes do not have enough time to diffuse. In a non-limiting example, the duration of the pulse used to excite the RSA is in a range from about 3-10 nanoseconds. In a further example, the pulse duration the duration of the pulse used to excite the RSA is in a range from about 10-100 nanoseconds. This provides, among other advantages, the ability to use longer write pulses, without heat bleeding, and without having to time the two focused beams during a very short pulse while doing the exposure.

In one embodiment, in addition to the holographic data recording process, other processes such as fixing the data, such as by fixing the photochemically converted dye to prevent any reverse conversion and/or by fixing remaining unconverted photochemically active dye to prevent any photochemical conversion, may also follow the step of recording the holographic data.

Figure 4:
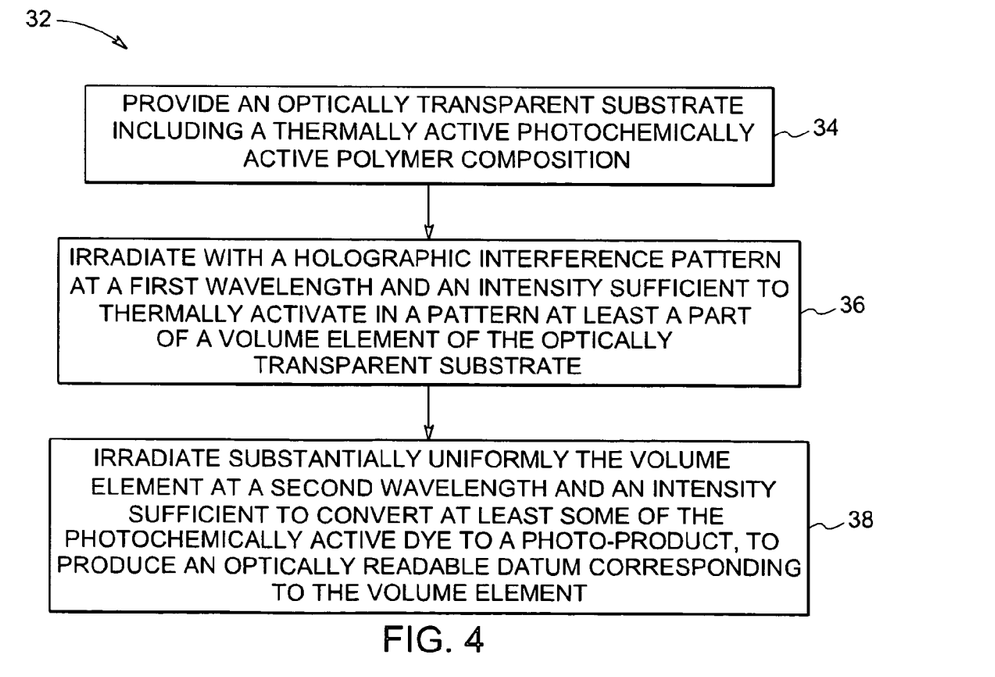
FIG. 4 is a flow chart illustrating another exemplary process for storing holographic data according to aspects of the present invention.

In another embodiment, a first radiation source is patterned, wherein heat is generated in a pattern within the volume element and the quantum efficiency is increased in a pattern within the column element. When this is combined with a substantially uniform irradiation, the irradiation could be coherent or incoherent, and then the refractive index variation resulting due to formation of photo-products also occurs in a pattern. FIG. 4 is a flow chart illustrating an exemplary process 32 of storing holographic data. The process includes providing an optically transparent substrate including a thermally active photochemically active polymer composition, the polymer composition comprising a photochemically active dye and a heat generating chromophore (step 34). In step 36, the volume element is irradiated with a holographic interference pattern at a first wavelength and at an intensity sufficient to thermally activate in a pattern at least a part of a volume element of the optically transparent substrate. In step 38, the volume element is irradiated substantially uniformly at a second wavelength and intensity sufficient to convert at least some of the photochemically active dye to a photo-product, to produce an optically readable datum corresponding to the volume element.

In one embodiment of the present invention is a holographic data storage device. The holographic data storage device includes an optically transparent substrate, wherein the optically transparent substrate includes a photochemically active dye and a heat generating chromophore. As discussed above, suitable examples of heat generating chromophores include reverse saturable dyes, linear responsive absorbers, and nanoparticles.

In a further embodiment of the present invention the holographic data storage device includes an optically transparent substrate including a photochemically active dye configured to convert to a photo-product upon irradiation and a heat generating chromophore configured to generate heat upon excitation. Non-limiting examples of excitation sources include optical radiation and AC magnetic fields.

In a another embodiment of the present invention is a method for making a holographic data storage device. The method includes mixing an optically transparent plastic material, a photochemically active dye, and a heat generating chromophore to form a mixed composition, and molding the mixed composition to form a holographic storage device.

Optically transparent plastic materials may be advantageously employed in the preparation of the optically transparent substrate. Optically transparent plastic materials used in producing holographic data storage media (such as the optically transparent substrate) can comprise any plastic material having sufficient optical quality, e.g., low scatter, low birefringence, and negligible losses at the wavelengths of interest, to render the data in the holographic storage material readable.

Organic polymeric materials, such as for example, oligomers, polymers, dendrimers, ionomers, copolymers such as for example, block copolymers, random copolymers, graft copolymers, star block copolymers; and the like, or a combination comprising at least one of the foregoing polymers can be used. Thermoplastic polymers or thermosetting polymers can be used. Examples of suitable thermoplastic polymers include polyacrylates, polymethacrylates, polyamides, polyesters, polyolefins, polycarbonates, polystyrenes, polyesters, polyamideimides, polyaromaticates, polyaromaticsulfones, polyethersulfones, polyphenylene sulfides, polysulfones, polyimides, polyetherimides, polyetherketones, polyether etherketones, polyether ketone ketones, polysiloxanes, polyurethanes, polyaromaticene ethers, polyethers, polyether amides, polyether esters, or the like, or a combination comprising at least one of the foregoing thermoplastic polymers. Some more possible examples of suitable thermoplastic polymers include, but are not limited to, amorphous and semicrystalline thermoplastic polymers and polymer blends, such as: polyvinyl chloride, linear and cyclic polyolefins, chlorinated polyethylene, polypropylene, and the like; hydrogenated polysulfones, ABS resins, hydrogenated polystyrenes, syndiotactic and atactic polystyrenes, polycyclohexyl ethylene, styrene-acrylonitrile copolymer, styrene-maleic anhydride copolymer, and the like; polybutadiene, polymethylmethacrylate (PMMA), methyl methacrylate-polyimide copolymers; polyacrylonitrile, polyacetals, polyphenylene ethers, including, but not limited to, those derived from 2,6-dimethylphenol and copolymers with 2,3,6-trimethylphenol, and the like; ethylene-vinyl acetate copolymers, polyvinyl acetate, ethylene-tetrafluoroethylene copolymer, aromatic polyesters, polyvinyl fluoride, polyvinylidene fluoride, and polyvinylidene chloride.

In some embodiments, the thermoplastic polymer, used in the methods disclosed herein as a substrate, is made of a polycarbonate. The polycarbonate may be an aromatic polycarbonate, an aliphatic polycarbonate, or a polycarbonate comprising both aromatic and aliphatic structural units.

Examples of useful thermosetting polymers include an epoxy, a phenolic, a polysiloxane, a polyester, a polyurethane, a polyamide, a polyacrylate, a polymethacrylate, or a combination including at least one of the foregoing thermosetting polymers.

The photochemically active dye may be mixed with other additives to form a photo-active material. Examples of such additives include heat stabilizers; antioxidants; light stabilizers; plasticizers; antistatic agents; mold releasing agents; additional resins; binders; blowing agents; and the like, as well as combinations of the foregoing additives. The photo-active materials are used for manufacturing holographic data storage media.

Cycloaliphatic and aromatic polyesters can be used as binders for preparing the photo-active material. These are suitable for use with thermoplastic polymers, such as polycarbonates, to form the optically transparent substrate. These polyesters are optically transparent, and have improved weatherability, low water absorption and good melt compatibility with the polycarbonate matrix. Cycloaliphatic polyesters are generally prepared by reaction of a diol with a dibasic acid or an acid derivative, often in the presence of a suitable catalyst.

Generally, the photochemically active dyes, heat generating chromophores and polymers used for forming the optically transparent substrate, and the holographic data storage medium should be capable of withstanding the processing conditions used to prepare the holographic data storage medium, for example during a step in which the photochemically active nitrostilbene and any additional additives which may be present are compounded with a polymer powder and subsequently molded into data storage disks.

In an exemplary embodiment, the photochemically active dye is present in an amount from about 0.1 to about 10 weight percent, based on the total weight of the optically transparent substrate, and has a UV-visible absorbance in a range between about 0.1 and about 1 at a wavelength in a range between about 300 nm and about 800 nm. Such dyes are used in combination with other materials, such as, for example, binders to form photo-active materials, which in turn are used for manufacturing holographic data storage media.

In one embodiment, the heat generating chromophore is present in a weight percentage greater than or equal to the weight percentage of the photochemically active dye. In another embodiment, the heat generating chromophore is present in a weight percentage lesser than the weight percentage of the photochemically active dye. In one embodiment, the heat generating chromophore is present in an amount corresponding to from about 0.1 to about 10 weight percent based on a total weight of the optically transparent substrate. In a further embodiment, the heat generating chromophore is present in an amount corresponding to from about 0.1 to about 2.0 weight percent based on a total weight of the optically transparent substrate.

In one embodiment, a film or disk of an optically transparent substrate including an optically transparent plastic material, at least one photochemically active dye and a heat generating chromophore is formed. Generally, the film is prepared by molding techniques using a molding composition that is obtained by mixing the dye with an optically transparent plastic material. Mixing can be conducted in machines such as a single or multiple screw extruder, a Buss kneader, a Henschel, a helicone, an Eirich mixer, a Ross mixer, a Banbury, a roll mill, molding machines such as injection molding machines, vacuum forming machines, blow molding machine, or the like, or a combination comprising at least one of the foregoing machines. Alternatively, the dye and the optically transparent plastic material may be dissolved in a solution and films of the optically transparent substrate can be formed from the solution.

In one embodiment a data storage composition including a photochemically active dye, thermoplastic polymer and a heat generating chromophore is injection molded to form an article that can be used for producing holographic data storage media. The injection-molded article can have any geometry. Examples of suitable geometries include circular discs, square shaped plates, polygonal shapes, or the like. The thickness of the articles can vary, from being at least 100 micrometers in an embodiment, and at least 250 micrometers in another embodiment. A thickness of at least 250 micrometers is useful in producing holographic data storage disks that are comparable to the thickness of current digital storage discs.

Without further elaboration, it is believed that one skilled in the art can, using the description herein, utilize the present invention to its fullest extent. The following examples are included to provide additional guidance to those skilled in the art in practicing the claimed invention. The examples provided are merely representative of the work that contributes to the teaching of the present application. Accordingly, these examples are not intended to limit the invention, as defined in the appended claims, in any manner.

EXAMPLE 1

A sample was prepared by dissolving 44.8 mg of the dinitrostilbene and 0.5059 g of high molecular weight commercial Lexan Polycarbonate in 5 ml of tetrachloroethane. 1.5 ml aliquots of this solution were spin coated onto a 50 mm silicon wafer at 2000 rpms for 35 seconds. The samples were placed in a vacuum oven overnight at 40° C.

Figure 5:
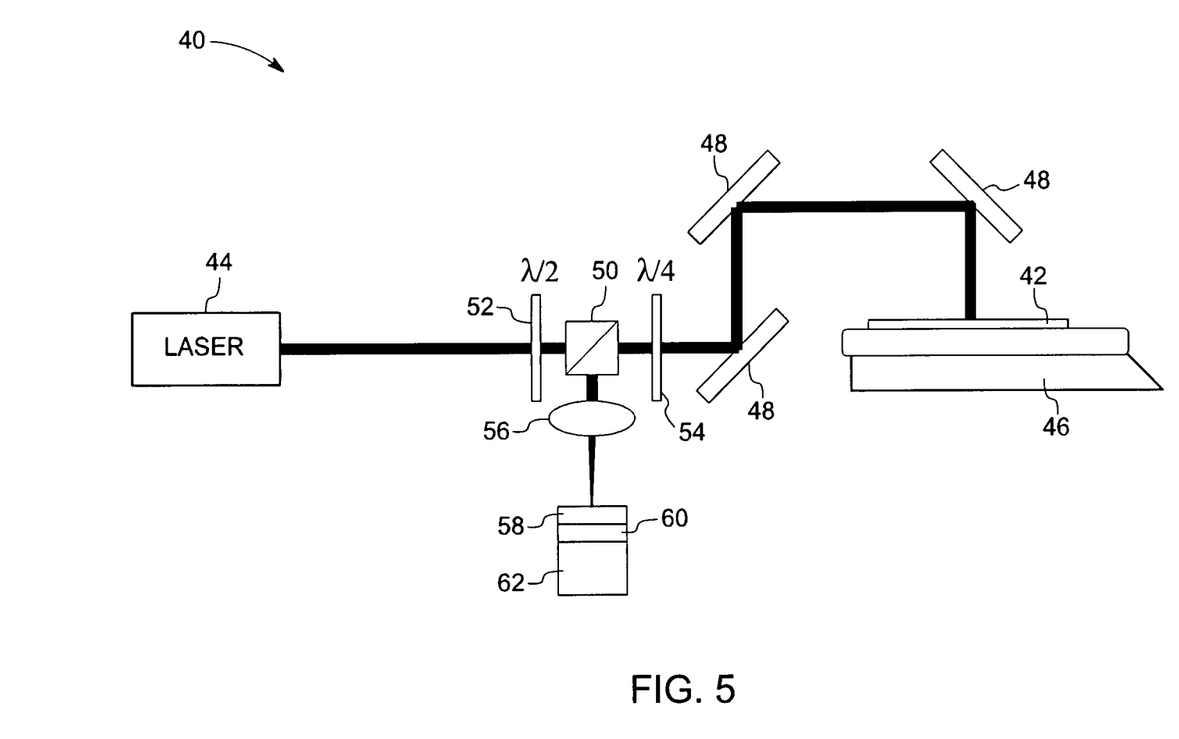
FIG. 5 is a schematic representation of a system measuring transmittance according to aspects of the present invention.

FIG. 5 is a schematic representation of a setup 40 for measuring the transmission of a thin-film sample 42 during exposure to a 100 mW cw (continuous-wave) laser 44 at 532 nm in accordance with one embodiment of the present invention. The sample 42, spun-cast film on polished silicon wafers, was placed flat on the surface of a temperature-controlled hot-plate 46. Mirrors 48 were used to raise the beam up over the hot-plate to minimize any influence of temperature on the mirror mounts. The half-wave plate 52 was used to set the polarization of the beam. A polarizing beam-splitter 50 and a subsequent quarter-wave plate 54 were used to separate the initial beam from the beam reflected from the sample for detection. The incident beam after passing through the film and was reflected from the silicon wafer, passing back through the film, and was focused by a lens 56 and ultimately directed towards a detector 62. The detector 62 was placed behind a 532 nm band-pass filter (Schott VG-9) 58 to remove any unwanted fluorescence and behind a neutral density filter 60 to keep the signal in the linear range of the detector.

Figure 6:
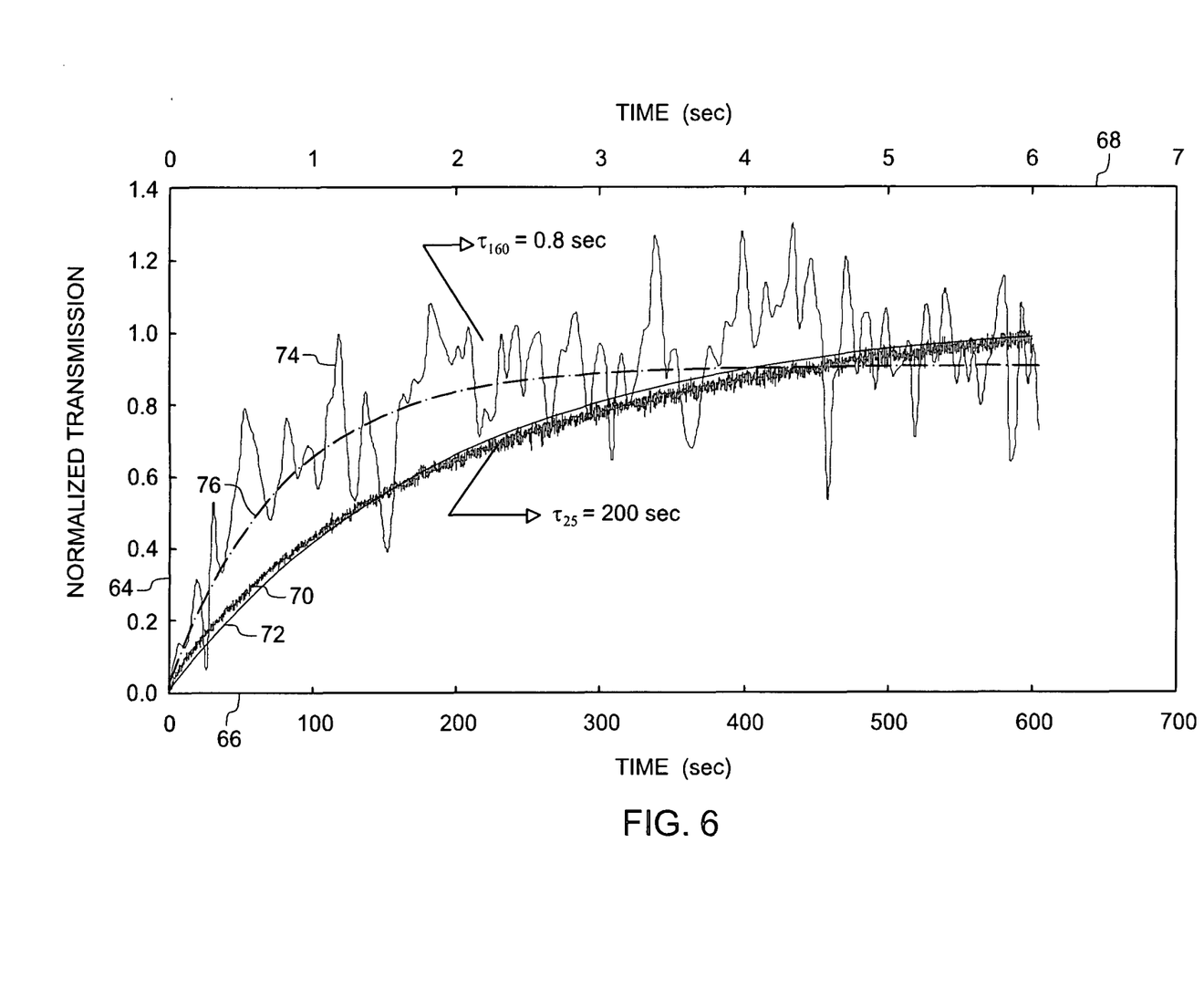
FIG. 6 is a comparative graph illustrating the variation in normalized transmission with exposure time for a process with and without thermal activation according to aspects of the present invention.

FIG. 6 is a comparative graph illustrating the variation in normalized transmission with photochemical conversion time for a process with and without thermal activation in accordance with one embodiment of the present invention. The graph illustrates the variation in normalized transmission 64 with exposure time for extended dimthylamino o-nitrostilbene dye in OQ Lexan at 25° C. 66 and at 160° C. 68. The graph shows the normalized transmission versus exposure time 70 and 74 at 25° C. and 160° C. respectively along with approximate fits 72 and 76. The fits point to a time constant of 200 seconds at exposure at 25° C. and a time constant of 0.8 seconds at 160° C. pointing to an increase in quantum efficiency of by a factor of about 250.

Figure 7:
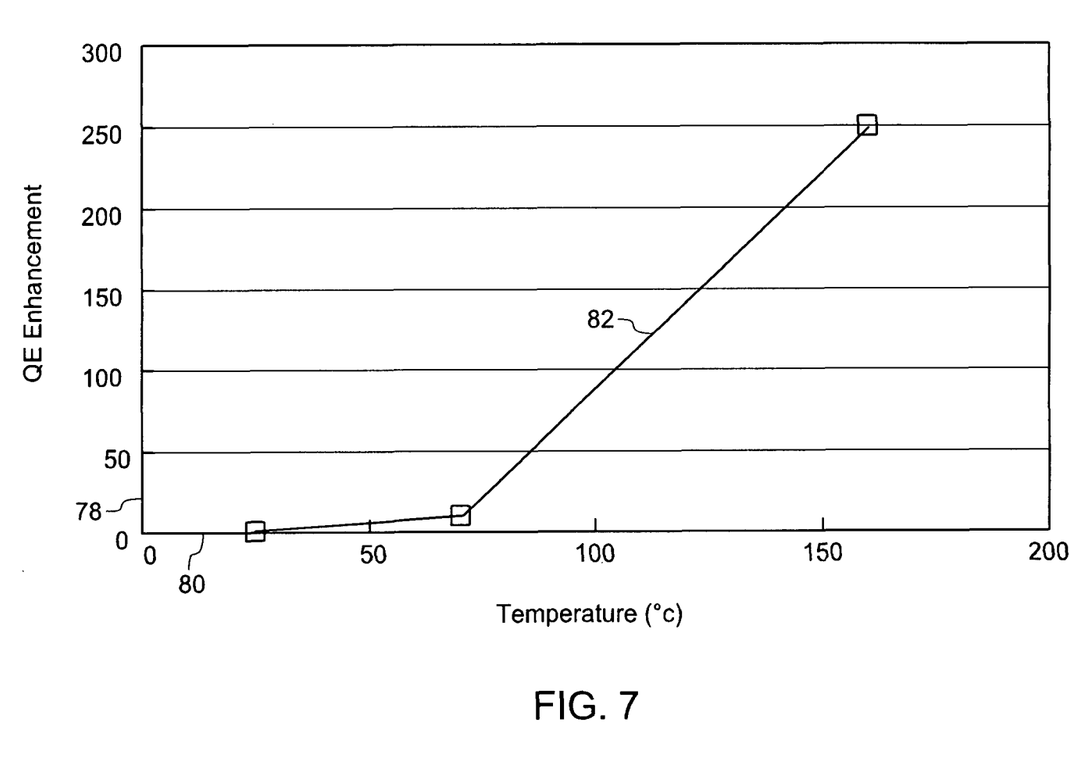
FIG. 7 is a graph illustrating the quantum efficiency enhancement with temperature according to aspects of the present invention.

FIG. 7 is a graph illustrating the quantum efficiency enhancement 78 with temperature 80 in accordance with one embodiment of the present invention. The quantum efficiency enhancement versus temperature profile 82 shows exponential type increase in quantum efficiency with temperature. This enhancement may be due to increased mobility or simply faster reaction kinetics due to the higher temperature or a combination of both.

EXAMPLE 2

A holographic data storage device is manufactured according to one embodiment of the present invention. A Henschel mixer is charged with 1000 grams of powdered optical grade polycarbonate or ground polystyrene, 20 grams (~2 wt %) of 4-methoxy-2',4'-dinitrostilbene, and 2.5 grams (~0.25 wt %) of Irgaphor Ultragreen MX (RSA dye). The mixture is thoroughly mixed to produce a uniform colored powder and used to produce 1.2 mm thick disks by injection molding samples on a Mini-jector®. The molding conditions vary depending upon the nature of the polymer matrix used to incorporate the photochemically active dye and the RSA dye. Typical conditions used for molding OQ (Optical Grade) polycarbonate and polystyrene based blends of the photochemically active dyes are shown in Table 1.

Individual disks prepared in this manner by injection molding are mounted in an apparatus to allowed holograms to be recorded. A pulsed laser beam output from a laser source (for example a long-coherence length, frequency-doubled, Q-switched, diode-pumped, solid-state Nd:YAG laser producing 1 ns to 10 ns pulses at a repetition rate of 10 kHz) at a wavelength of 532 nm is split into two beams of equal powers (using for example a half-wave plate and polarizing beam-splitter or a 50% reflectivity coated dielectric mirror) and identical polarization states. Mirrors are used to steer the beams into a counter-propagating configuration in which one beam enters the substrate from one side and the other beam enters directly from the opposite side. Lenses are used to focus the beams into the substrate and the beams are aligned such that the focus from both beams completely overlap in 3 dimensions in the sample. As a result of the overlap of the beams, a standing-wave interference pattern is created at the foci, composed of sinusoidally varying bright and dark intensity regions. The pulse energy of each beam is chosen to be at least 1 nJ/pulse such that the reverse saturable absorber dye absorbs enough of the incident light energy and converts the absorbed light energy into heat. For longer pulses, higher pulse energy is required. The heat elevates the temperature of the sample in the bright spots above the Tg of the polymer (~100° C. for polystyrene and ~150° C. for polycarbonate). The increased mobility of the polymer in regions at or above Tg and the dissolved nitrostilbene dye in the these areas cause the nitrostilbene to have a higher QE for photochemical conversion and a hologram is effectively written in the material using this single wavelength of light.

TABLE 1

Typical conditions used for molding OQ (Optical Grade) polycarbonate and polystyrene based blends of the photochemically active dyes.

| Molding Parameters | OQ Polycarbonate Powder | Polystyrene Powder |
| --- | --- | --- |
| Barrel Temp. (Rear) (° F.) | 500 | 400 |
| Barrel Temp. (Front) (° F.) | 540 | 395 |
| Barrel Temp. (Nozzle) (° F.) | 540 | 395 |
| Mold Temp. (° F.) | 200 | 100 |
| Total Cycle Time (sec) | 35 | 25 |
| Switch Point (inch) | 0.7 | 0.7 |
| Injection Transition (inch) | 0.22 | 0.22 |
| Injection Boost Press. (psi) | 950 | 850 |
| Injection Hold Press. (psi) | 300 | 250 |

EXAMPLE 3

A Henschel mixer is charged with 1000 grams of powdered optical grade polycarbonate or ground polystyrene, about 20 grams of 2-nitrostilbene, and about 1.0 (?) gram of Irgaphor Ultragreen MX (RSA dye). The mixture is thoroughly mixed to produce a uniform colored powder and used to produce 1.2 mm thick disks by injection molding samples on a Mini-jector®. The molding conditions vary depending upon the nature of the polymer matrix used to incorporate the photochemically active dye and the RSA dye.

Individual disk prepared in this manner by injection molding are mounted in an apparatus to allowed holograms to be) recorded. A pulsed laser beam (~1 ns-10 ns) output from a laser source at a wavelength of 532 nm with a pulse energy of 1 nJ/pulse is focused into a volume element a hologram will be written into to raise the temperature of the volume element substantially uniformly to at or above Tg. The step of writing the hologram is done simultaneously, or with overlap or following the heating of the volume element. A pulsed laser beam output from a laser source at a wavelength of 405 nm with a pulse energy of 1 nJ/pulse is split into two beams of equal powers and identical polarization states. The beams are focused and overlapped at the region of increased temperature within the disk to form a holographic interference pattern. Due to the higher QE for photochemical conversion at increased temperature region a hologram is effectively written in the material.

While only certain features of the invention have been illustrated and described herein, many modifications and changes will occur to those skilled in the art. It is, therefore, to be understood that the appended claims are intended to cover all such modifications and changes as fall within the true spirit of the invention.

The invention claimed is:

1. A holographic data storage device comprising an optically transparent substrate, wherein the optically transparent substrate comprises a photochemically active dye which increases in quantum efficiency from absorbing in a range from an ultraviolet (UV) spectrum through a visible spectrum and a heat generating chromophore configured to photoexcite in response to a wavelength from approximately 300 nm to approximately 800 nm and deexcite to generate heat to increase the quantum efficiency of the photochemically active dye.

2. The holographic data storage device of claim 1, further comprising a photo-product of the photochemically active dye.

3. The holographic data storage device of claim 2, wherein the photo-product comprises a photo-stable decomposition product, a photo-stable product of oxidation, a photo-stable product of reduction, a photo-stable product of bond breaking, or a photo-stable molecular rearrangement product.

4. The holographic data storage device of claim 1, wherein the heat generating chromophore comprises reverse saturable absorber chromophore.

5. The holographic data storage device of claim 4, wherein the reverse saturable absorber comprises at least one material comprising metallophthalocyanines or fullerene dyes.

6. The holographic data storage device of claim 1, wherein the heat generating chromophore comprises a linear responsive absorber chromophore.

7. The holographic data storage device of claim 6, wherein the linear responsive absorber chromophore comprises at least one material comprising phthalocyanine dyes, anthraquinone dyes, rhodamine dyes, triarylmethine dyes, tris amminium dyes, metal dithiolene dyes or any combination thereof.

8. The holographic data storage device of claim 1, wherein the heat generating chromophore comprises a metallic or core shell nanoparticle.

9. The holographic data storage device of claim 8, wherein the metallic or core shell nanoparticle comprises at least one material comprising gold spherical nano-particles, silver spherical nano-particles, gold ellipsoidal nano-particles, silver ellipsoidal nano-particles, gold nano-rods, silver nano-rods, gold coated core-shell nano-particles, silver coated core-shell nano-particles, gold triangular nano-particles, silver triangular nano-particles, magnetic nano-particles, or any combination thereof.

10. The holographic data storage device of claim 1, wherein the heat generating chromophore is present in an amount corresponding to from about 0.1 to about 10 weight percent based on a total weight of the optically transparent substrate.

11. The holographic data storage device of claim 1, wherein the heat generating chromophore is present in an amount corresponding to from about 0.1 to about 2 weight percent based on a total weight of the optically transparent substrate.

12. The holographic data storage device of claim 1, wherein the photochemically active dye comprises a nitrostilbene.

13. The holographic data storage device of claim 1, wherein the nitrostilbene comprises a material comprising 4'-dimethylamino-2'-4'-dinitrostilbene, 4-dimethylamino-4'-cyano-2'-nitrostilbene, 4-hydroxy-2'-4'-dinitrostilbene, or 4-methoxy-2', 4'-dinitrostilbene, or any combination thereof.

14. The holographic data storage device of claim 1, wherein the optically transparent substrate comprises an optically transparent plastic material.

15. The holographic data storage device of claim 1, wherein the optically transparent substrate comprises a material comprising a thermoplastic polymer, a thermosetting polymer, or a combination of a thermoplastic polymer and a thermosetting polymer.

16. The holographic data storage device of claim 1, wherein the thermoplastic polymer comprises a polycarbonate.

17. A holographic data storage device comprising an optically transparent substrate, wherein the optically transparent substrate comprises a photochemically active dye which increases in quantum efficiency from absorbing in a range from an ultraviolet (UV) spectrum through a visible spectrum and a reverse saturable absorber chromophore configured to photoexcite in response to a wavelength from approximately 300 nm to approximately 800 nm and deexcite to generate heat to increase the quantum efficiency of the photochemically active dye.

18. The holographic data storage device of claim 17, wherein the reverse saturable absorber chromophore is photoexcitable to generate heat at wavelength from about 500 nm to 800 nm.

19. A holographic data storage device comprising an optically transparent substrate, wherein the optically transparent substrate comprises a photochemically active dye which increases in quantum efficiency from absorbing in a range from an ultraviolet (UV) spectrum through a visible spectrum and configured to convert to a photo-product upon irradiation and a heat generating chromophore configured to photoexcite in response to a wavelength from approximately 300 nm to approximately 800 nm and deexcite to generate heat to increase the quantum efficiency of the photochemically active dye.

20. The holographic data storage of claim 19, wherein photochemically active dye is configured to convert to a photo-product upon irradiation at wavelength from about 300 nm to about 800 nm.

21. The holographic data storage of claim 20, wherein the heat generating chromophore is configured to convert to a photo-product upon irradiation at wavelength from about 300 nm to about 800 nm.

22. A method of making a holographic data storage device comprising:
mixing an optically transparent plastic material, a photochemically active dye which increases in quantum efficiency from absorbing in a range from an ultraviolet (UV) spectrum through a visible spectrum, and a heat generating chromophore photoexcitable in response to a wavelength from approximately 300 nm to approximately 800 nm to form a mixed composition, wherein the photochemically active dye has a quantum efficiency changeable by heat generated by the heat generating chromophore when the heat generating chromophore is deexcited; and molding the mixed composition to form a holographic storage device.

\* \* \* \* \*